(12) United States Patent
Tahara et al.

(10) Patent No.: US 7,892,986 B2
(45) Date of Patent: Feb. 22, 2011

(54) ASHING METHOD AND APPARATUS THEREFOR

(75) Inventors: Shigeru Tahara, Nirasaki (JP); Eiichi Nishimura, Nirasaki (JP); Kumiko Yamazaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 195 days.

(21) Appl. No.: 12/052,239

(22) Filed: Mar. 20, 2008

(65) Prior Publication Data

US 2008/0233766 A1    Sep. 25, 2008

(30) Foreign Application Priority Data

Mar. 22, 2007   (JP)  ............................ 2007-074592

(51) Int. Cl.
*H01L 21/26* (2006.01)

(52) U.S. Cl. .............................. 438/795; 257/E21.294; 257/E21.492; 430/329; 438/725

(58) Field of Classification Search .......... 257/E21.294, 257/E21.492; 430/329; 438/725, 795
See application file for complete search history.

(56) References Cited

U.S. PATENT DOCUMENTS

| 6,592,771 B1 | 7/2003 | Yamanaka et al. | |
|---|---|---|---|
| 2001/0000409 A1* | 4/2001 | Mitsuhashi | ............... 250/492.2 |
| 2004/0084412 A1* | 5/2004 | Waldfried et al. | ............. 216/67 |

FOREIGN PATENT DOCUMENTS

JP             63-260030       10/1988

* cited by examiner

*Primary Examiner*—Asok K Sarkar
(74) *Attorney, Agent, or Firm*—Oblon, Spivak, McClelland, Maier & Neustadt, L.L.P.

(57) ABSTRACT

An ashing method of a target substrate is applied after plasma-etching a part of a low-k film by using a patterned resist film as a mask in a vacuum processing chamber. The method includes a process of removing the resist film in the vacuum processing chamber, and a pre-ashing process, performed prior to the main ashing process, for ashing the target substrate for a time period while maintaining the target substrate at a temperature in a range of from about 80 to 150° C.

4 Claims, 4 Drawing Sheets

ASHING METHOD AND APPARATUS THEREFOR

FIELD OF THE INVENTION

The present invention relates to an ashing process for removing a photoresist in a semiconductor manufacturing process; and, more particularly, to an ashing method and apparatus therefor, for removing a photoresist film deteriorated after a dry-etching treatment by using a gas containing hydrogen radicals.

BACKGROUND OF THE INVENTION

Semiconductor devices have been manufactured by a wet etching method, which is performed by: uniformly coating a photoresist on a conductive metal layer, an insulating layer or a low-k layer which is formed on a substrate such as a silicon wafer or the like by CVD deposition or the like; forming a photoresist pattern by performing selective exposure and development thereon; forming a fine circuit by selectively etching the conductive metal layer or the like formed by the deposition or the like while using the photoresist pattern as a mask; and removing an unnecessary photoresist layer by peeling solution. Recently, however, a dry etching method adapted for a higher-density fine etching is mainly used along with the trend for high density of an integrated circuit.

The dry etching method enables a fine etching compared to the wet etching method, but has a drawback in which the photoresist film is easily deteriorated by the dry etching. The deteriorated film is not easily peeled off by the ashing process for removing a resist, so that a residue of the resist is apt to be generated.

Conventionally, a method for injecting oxygen or oxygen radicals to a resist has been used in the ashing process. In this method, the oxygen radicals react with an organic resist material while being heated, thereby oxidizing carbon and hydrogen in the resist. Then, gaseous reaction products are removed by volatilization.

Recently, however, a material having a low dielectric constant (low-k material) than that of silicon oxide is being widely used for an interlayer dielectric of a semiconductor device. The low-k material is made of polymer containing silicon (Si), oxygen (O), carbon (C) and hydrogen (H). However, the low-k material has low ashing resistance. This is because organic components C and H become gases and removed by the reaction between the oxygen radials and the low-k material, whereby a dielectric constant increases. Accordingly the original purpose of using the low-k material is not achieved.

Therefore, in order to reduce damage of a low-k material in an ashing process, an ashing process using hydrogen radicals has been recently implemented. In this ashing process, hydrogen radicals react with a resist at a high temperature of about 250° C. or higher, thereby cutting carbon bonds (C=C or C—C) in the resist material and producing hydrocarbons of low molecular weight, which will be volatilized as gases.

As for the plasma ashing apparatus using hydrogen radicals, Japanese Patent Laid-open Application No. S63-260030 discloses therein a plasma ashing apparatus for performing an ashing process by providing on a substrate a plasma of a processing gas introduced into a vacuum chamber, the plasma being converted from the processing gas by application of a high frequency to an electrode in a plasma generating chamber provided above a substrate mounting table installed in the vacuum chamber.

However, the plasma ashing process is disadvantageous in that charged particles existing in the plasma inflict damages on devices of a substrate or cause metal contamination. To that end, Japanese Patent Laid-open Application No. 2000-294535 suggests a high-density down-flow type ashing apparatus capable of preventing ions from being directly irradiated to a target substrate by separating a plasma generating chamber from a substrate processing chamber.

The down-flow type plasma ashing apparatus can also be used as an etching apparatus as well as an ashing apparatus. In this apparatus, the substrate is heated by heat transfer from a mounting surface heated by a heating unit buried in a substrate mounting table.

The ashing by the above down-flow type plasma ashing apparatus using hydrogen radicals is advantageous in that a low-k material is less damaged, but is disadvantageous in that a residue of a resist is apt to be generated. The generation of the resist residue is thought to be due to fluorocarbon (CF) polymers generated by an etching process and then deposited on a resist surface, quality deterioration of the resist from the heat during the etching process or the like.

The inventors of the present invention have conducted investigation to explain a mechanism for generating the resist residue and suggest a solution thereto. Hereinafter, the investigation result will be described with reference to accompanying drawings.

FIGS. 4A to 4D show schematic views of images captured by an electron microscope used in monitoring the changes in the resist layer occurring by heating the plasma-etched target substrate at 300° C. for about 20 to 30 seconds.

As shown in FIG. 4A, it was found that a deteriorated layer 3 is formed on a surface of a resist layer 2 on a substrate 1 by the effects of the plasma etching process or a post heat treatment thereof. As a result of various analyses performed on the deteriorated layer 3, the following conclusion has been reached: the resist layer is softened and melts by exposure to a high temperature during the plasma etching process, and carbonization takes place by separation of hydrogen from the softed molten resist layer by an etching gas. As a consequence, a hardened layer is formed on a resist surface. Namely, the deteriorated layer 3 is formed by the effects of heat and the separation of hydrogen by the etching gas. Moreover, it was found that a thickness of the deteriorated layer 3 is about several tenth of a total layer thickness of the resist layer 2. It was also found that parts of the deteriorated layer 3 has several portions that are not flat but are locally wavy as shown in FIG. 4A.

Here, it is considered that the deteriorated layer 3 is thought to be transformed in a wavy shape by a following mechanism. Upon completion of the plasma etching process, the target substrate is generally ashed at a high temperature higher than or equal to 250° C. Accordingly, a temperature difference occurs between a lower portion of the target substrate and a surface of the target substrate, as depicted in FIG. 4B. For example, the lower portion has a temperature of about 100° C., and the surface has a temperature of about 300° C. Besides, the deteriorated layer 3 is different in quality from the original resist, so that a thermal expansion coefficient of deteriorated layer 3 is different from that of the original resist. Therefore, if the target substrate is heated at a high temperature, the surface thereof is compressed by thermal expansion, whereby the deteriorated layer 3 has a wavy shape, as shown in FIG. 4A.

As a result of monitoring the deteriorated layer 3 thoroughly, it was found that there exists a plurality of portions where the deteriorated layer 3 is locally thick as shown in FIG. 4C or where a cavity 4 is formed between the deteriorated layer 3 and the resist layer 2 as shown in FIG. 4D.

In the abnormally shaped portions (thick portions or cavities) of the deteriorated layer 3, it is difficult for hydrogen radicals to diffuse during the ashing process. Therefore, it is believed that the hydrogen radicals are suppressed from penetrating into the resist layer under the abnormally shaped portions. Accordingly, in the abnormally shaped portions of the deteriorated layer 3, the hydrogen radicals may not reach a deep portion of the resist layer, thus hindering cutting of carbon bonds by the hydrogen radicals. These effects are considered to cause the increase of the ashing time and the generation of the resist residue.

The resist residue is considered to be mainly made of amorphous carbon due to the reason described below. When the cutting of carbon bonds by the hydrogen radicals is not effectively made, long-chain hydrocarbon molecules remain on the target substrate without turning into a gas, and then are thermally decomposed by heating at a high temperature during the ashing process. As a result, only hydrogen is removed as a gas, leaving carbon chains. The resist residue thus generated deteriorates the performance of semiconductor devices and causes a poor production yield.

Therefore, if the penetration of hydrogen radicals is facilitated by suppressing the formation of the deteriorated layer 3, it is possible to reduce the resist residue and shorten the ashing time. The inventors of the present invention have made the present invention as a result of various studies to provide a simple and practical device for changing a property of the deteriorated layer 3.

SUMMARY OF THE INVENTION

In view of the above, the present invention provides a simple and practical device capable of shortening ashing time and reducing a resist residue in an ashing process of removing a photoresist.

In accordance with a first aspect of the present invention, there is provided an ashing method of a target substrate, applied after plasma-etching a part of a low-k film by using a patterned resist film as a mask in a vacuum processing chamber, including: a process of removing the resist film in the vacuum processing chamber, and a pre-ashing process, performed prior to the main ashing process, for ashing the target substrate for a time period while maintaining the target substrate at a temperature in a range from about 80 to 150° C.

Here, a maximum temperature of the target substrate during the pre-ashing process is preferably higher than a glass transition temperature of the resist film by about 30° C.

By performing the pre-ashing process, a deteriorated layer hardened by the plasma etching is softened, so that the hydrogen radicals can easily penetrate into the resist layer during the main ashing process. Accordingly, the resist residue can be reduced remarkably, and the resist removal time is shortened.

In accordance with a second aspect of the invention, there is provided an ashing apparatus including: a vacuum processing chamber; a mounting table, for mounting thereon a target substrate on which a resist film is coated, having therein a heating unit for heating the target substrate; an inlet port for introducing radicals of a reactant gas provided by a remote plasma generator, wherein the resist film of the target substrate is removed by the radicals of the reactant gas introduced from the inlet port; and an elevation mechanism for controlling a temperature of the target substrate to a desired level by adjusting a gap between the target substrate and the mounting table.

In the ashing apparatus of the present invention, a temperature of the target substrate can be finely controlled in the pre-ashing process by adjusting the gap between the target substrate and the mounting table by the elevation mechanism. In addition, when the pre-ashing process is shifted to the main ashing process, the target substrate can be quickly heated to the temperature of the main ashing process by making the target substrate contact the mounting table.

In accordance with a third aspect of the invention, there is provided an ashing apparatus including: a vacuum processing chamber; a supporting unit for horizontally supporting a target substrate having thereon a resist film from a side or a bottom portion thereof; an inlet port for introducing radicals of a reactant gas provided by a remote plasma generator; a heating unit, disposed under the target substrate, for heating, with radiant heat, a bottom surface of the target substrate; and a heat controlling unit for controlling the amount heat radiated from the heating unit, wherein the resist film of the target substrate is removed by the radicals of the reactant gas introduced from the inlet port, and a temperature of the target substrate being processed is precisely controlled by the heat controlling unit.

In this ashing apparatus, the target substrate is supported from a side or a bottom portion thereof without being mounted on the mounting table, and the bottom surface of the target substrate is directly heated by the radiant heating unit provided under the target substrate. Since the target substrate has a small heat capacity, the temperature of the target substrate can be raised or lowered quickly. Further, the heat controlling unit makes it possible to precisely control the temperature of the target substrate, and is useful for the control of the temperature of the target substrate especially in the pre-ashing process.

The ashing apparatus preferably further includes a unit for measuring the temperature of the target substrate; and a unit for controlling the temperature of the target substrate being processed based on the measured temperature. Accordingly, it is possible to quickly and precisely control the temperature of the target substrate in the pre-ashing process.

In accordance with the aspects of the present invention, there is provided a simple and practical device capable of shortening ashing time and reducing a resist residue during an ashing process using radicals of a reactant gas.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

First, how the method of the present invention has been conceived will be explained. It is known that a generation of a resist residue from an ashing process using radicals of a reactant gas occurs frequently when the resist has been plasma etched. It is assumed that this is because a plurality of abnormally shaped portions such as thick portions or cavities exist on a deteriorated layer formed on a surface of the resist layer during the plasma etching process and prevent the radicals from penetrating into the resist layer.

In order to verify the above assumption, there has been executed a test for comparing a speed of removing a g-line resist coated on a substrate in an ashing process using radicals, e.g., hydrogen radicals, of a reactant gas between a case where a plasma etching process had been performed and a case where no plasma etching process had been performed.

Figure 1:
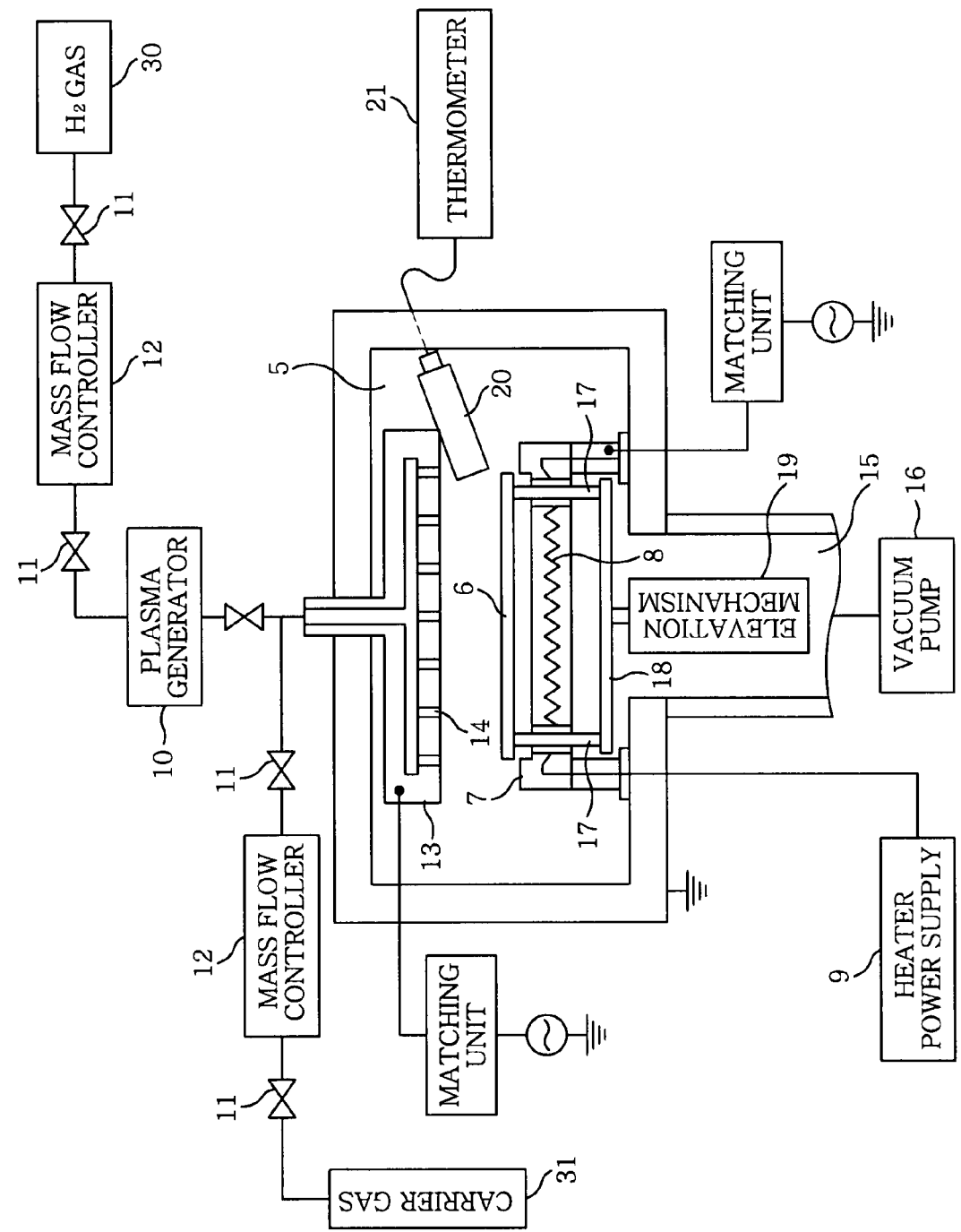
FIG. 1 is a schematic cross sectional view of an ashing apparatus in accordance with an embodiment of the present invention.

The etching process was carried out by using a plasma etching apparatus also serving also as an ashing apparatus shown in FIG. 1. A pressure in a processing chamber 5 shown in FIG. 1 was maintained at 50 mTorr, and high frequency powers of 1200/1700 W were respectively applied to a shower head 13 serving as an upper electrode and a susceptor 7 serving as a lower electrode. Flow rates of etching gases of $C_4F_8/Ar/N_2$ were 7/1000/100 cc/min, respectively. Moreover, a gap between upper and lower electrodes of parallel plates was 35 mm.

The ashing process was performed by using the above aching apparatus also serving as a plasma ashing apparatus. An inductively coupled remote plasma was generated by a plasma generator 10 without applying a power between the shower head 13 serving as the upper electrode and the susceptor 7 serving as the lower electrode. Following processing conditions were set: a plasma generation power in the plasma generator 10 being 1500 W; a pressure in a chamber at 1.5 Torr; an ashing gas of 4% $H_2$ and 96% He having a flow rate of 9000 cc/min a temperature of a substrate mounting table controlled in three stages at 250° C., 300° C. and 350° C. In these processing conditions, the resist removal speeds in the ashing process using hydrogen radicals were measured. The ashing process was performed for a period of time that was prolonged by 30% after detecting an end point by analyzing the emission spectrum from the chamber during the ashing process.

Figure 3:
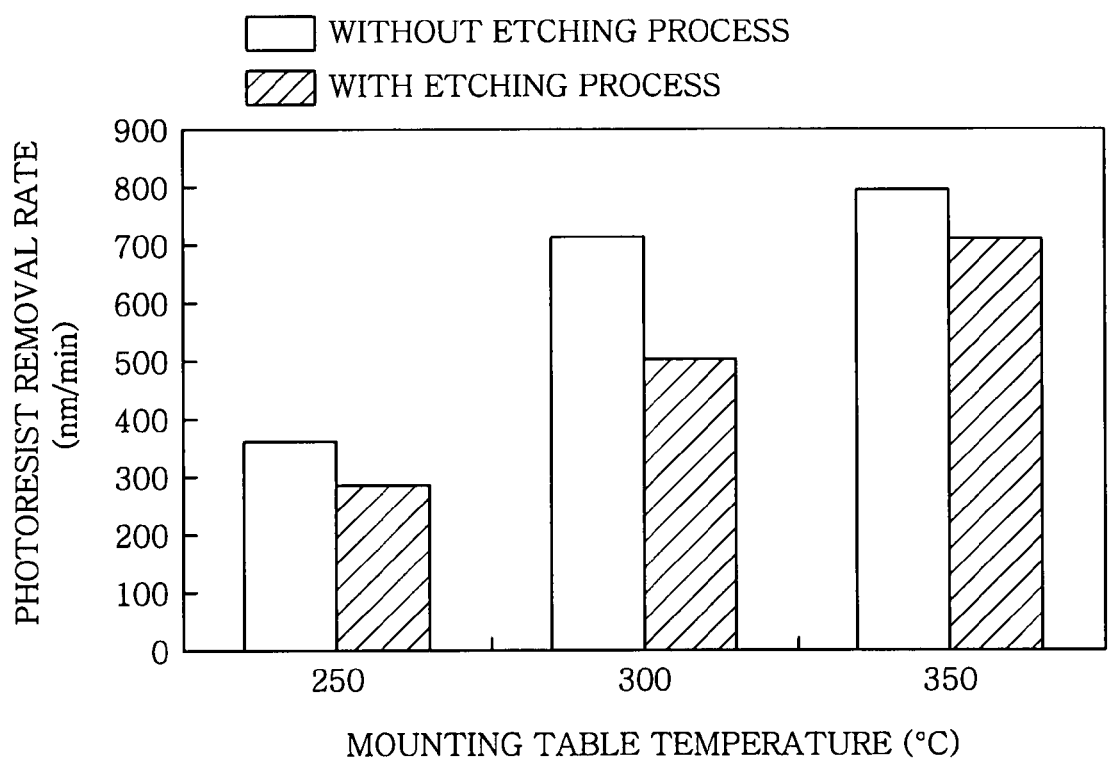
FIG. 3 shows comparison in a resist removal speed between when a plasma etching process is performed and when no plasma etching process is performed.
Figure 4A:
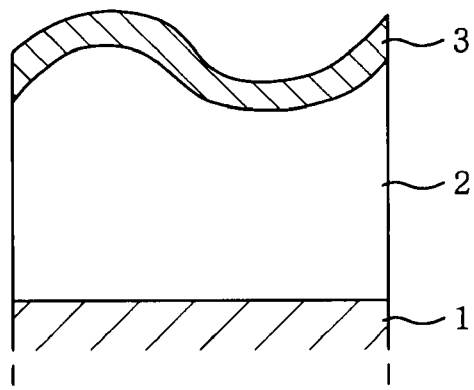
FIGS. 4A to 4D explain states of a deterioration status of a resist layer by the plasma etching process.
Figure 4B:
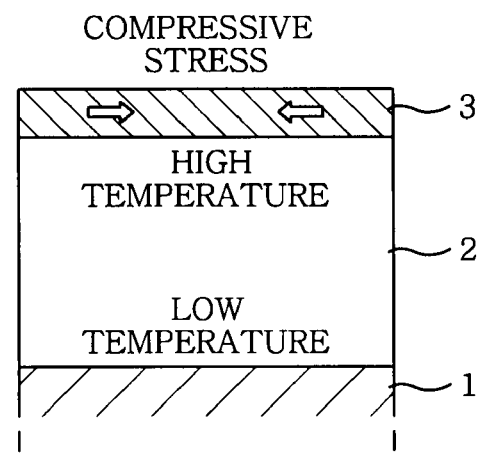
Figure 4C:
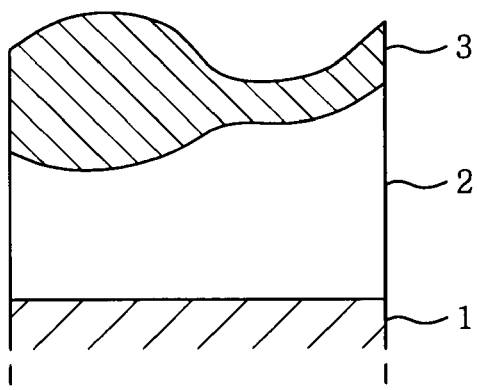
Figure 4D:
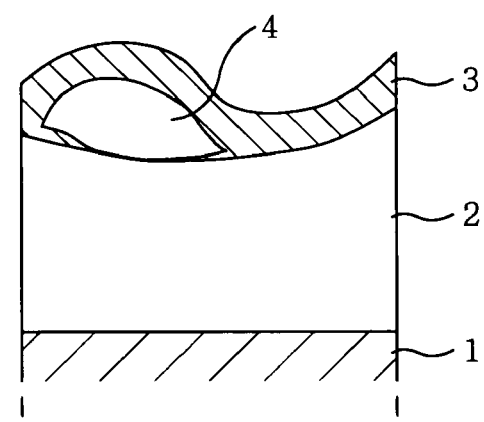

The resist removal speed was calculated based on each of the end points. FIG. 3 shows the measurement result. This result shows that at all temperatures, the resist removal speed was lower in a case where the plasma etching process has been performed than in a case where no plasma etching process has been performed, and also verifies the assumption that the deteriorated layer formed on the surface of the resist layer by the plasma etching process, and especially the abnormally shaped portions thereof (thick portions or cavities), hinder the penetration of hydrogen radicals into the resist layer. Further, from the above result, it was found that the resist removal speed increases as a temperature of the mounting table (i.e., a temperature of the target substrate) increases.

Further, ashing was performed under the above conditions for about four minutes while setting a temperature of the mounting table at 350° C., to thereby monitor by naked eye a remaining state of the resist residue between the cases where the plasma etching process had and had not been performed. As a result, when the plasma etching process had been performed, a considerable amount of resist residue was detected on the entire surface of the target substrate. However, when no plasma etching process had been performed, the resist residue was hardly detected. This result also supports the assumption that the deteriorated layer and the abnormally shaped portions thereof formed in the plasma etching process cause the generation of the resist residue.

The above result suggests the possibility that a pre-ashing process, which reduces the abnormally shaped portions (thick portions and cavities) of the deteriorated layer by softening the plasma-etched resist layer through heat treatment, may increase the speed of the ashing process using radicals, e.g., hydrogen radicals or the like, of a reactant gas, and also reduce the resist reside.

Therefore, the plasma-etched resist was ashed by performing a two-stage ashing process at two temperature levels, i.e., the pre-ashing for exposing the resist to the hydrogen radicals at a relatively low temperature (about 80 to 150° C.) and the main ashing for exposing the resist to the hydrogen radicals at a high temperature (about 300° C.). Then, a generation state of the resist residue was examined.

The conditions applied to the plasma etching and main ashing processes are the same as those of the test described in FIG. 3 in which the temperature of the substrate table was controlled at about 300° C. The pre-ashing process was performed at four temperature levels of about 80° C., about 100° C., about 120° C. and about 150° C. The pre-ashing time was about 20 seconds, and the main ashing time was prolonged by 30% after detecting an end point by analyzing the emission spectrum from the chamber during the main ashing process. However, at the pre-ashing temperature of about 80° C., the pre-ashing process was carried out for about 20 seconds and for about 40 seconds. Further, in a comparative example, the pre-ashing process was not carried out. The generation states of the resist reside were evaluated by naked eye in three categories: O (almost non-existence of resist residue), Δ (small amount of resist residue) and X (existence of resist residue). The test result is shown in following Table 1.

TABLE 1

| Test piece | Pre-ashing Temperature(° C.) | Time | Main ashing Temperature(° C.) | Resist residue generation state |
|---|---|---|---|---|
| 1 | — | — | 300 | X |
| 2 | 80 | 20 | 300 | X |
| 3 | 80 | 40 | 300 | Δ |
| 4 | 100 | 20 | 300 | Δ |
| 5 | 120 | 20 | 300 | O |
| 6 | 150 | 20 | 300 | O |

As can be seen from Table 1, in a test piece 1, on which no pre-treatment was performed and a test piece 2 (pre-treatment at about 80° C. for about 20 seconds), the resist residue was clearly found. In a test piece 3 (pre-treatment at about 80° C. for about 40 seconds) and a test piece 4 (pre-treatment at about 100° C. for about 20 seconds), a small amount of resist residue was found. On the contrary, in a test piece 5 (pre-treatment at about 120° C. for about 20 seconds) and a test piece 6 (pre-treatment at about 150° C. for about 20 seconds), the resist residue was hardly found.

From the above result, it was found that the resist residue can be reduced by performing the ashing process at two temperature levels. It is found that the temperature of the pre-ashing process is preferably between about 80 and 150° C., and also that the pre-ashing time is preferably about 20 seconds. Further, when the temperature of the pre-ashing process is low, the processing time need to be prolonged.

It seems that the pre-ashing process provides effects of softening the deteriorated layer formed during the plasma etching process (mainly, a layer hardened by the carbonization caused by the separation of hydrogen during the plasma etching process) by adding hydrogen to the deteriorated layer by exposing it to hydrogen radicals at a low temperature. It was found that a proper temperature of the pre-ashing process is related to a glass transition temperature Tg of a resist material, and that a maximum temperature of the pre-ashing process is preferably higher than Tg (Tg of the resist used in the test of Table 1 was about 126° C.) by about 30° C. The reason why the maximum temperature of the pre-ashing process is set higher than Tg by about 30° C. is that if the temperature is set higher than the maximum temperature, the resist may be burned, or the low-k material or the like placed thereunder may be damaged by heat. Although the conditions applied in the main ashing process are the same as those used in the conventional resist removing process using hydrogen radicals, it is clear that the resist removal time is shortened, as will be described in an example to be described later.

Hereinafter, an ashing apparatus of the present invention will be described. FIG. 1 is a schematic cross sectional view of an ashing apparatus in accordance with the embodiment of the present invention. This apparatus includes a substantially cylindrical airtight processing chamber 5. The processing chamber 5 has therein a mounting table (hereinafter, referred to as a "susceptor") 7 for mounting and horizontally supporting a target substrate 6 thereon. A heater 8 is buried in the susceptor 7, and generates heat by the power supplied from a heater power supply 9, thereby increasing a temperature of the susceptor 7 and heating the target substrate 6 by conductive or radiant heat transfer. This ashing apparatus can also serve as a plasma etching apparatus, because it is possible to generate a plasma by respectively applying high frequency powers to a shower head 13 serving as an upper electrode and the susceptor 7 serving as a lower electrode.

A plasma generator 10 is provided above the processing chamber 5. When a hydrogen gas or a hydrogen gas diluted with an inactive gas is supplied thereto from a hydrogen gas source 30 via an on/off valve 11 and a mass flow controller 12, the supplied gas is converted into a plasma, thereby generating hydrogen radicals. Meanwhile, a carrier gas such as Ar, He or the like is supplied from a carrier gas source 31 via an on/off valve 11 and a mass flow controller 12.

The hydrogen radicals mixed with the carrier gas are introduced into the shower head 13 disposed above the processing chamber 5, and are discharged from a plurality of discharge openings 14 formed in a bottom surface of the shower head 13. The target substrate 6 is exposed to the gas discharged therefrom.

In the present invention, a known remote plasma technique can be used in the plasma generator 10. Further, a vacuum exhaust port 15 is provided at a bottom portion of the processing chamber 5. Accordingly, the target substrate 6 is exposed to hydrogen radicals while maintaining the inside of the processing chamber 5 in a vacuum state. Moreover, the target substrate 6 is supported at a bottom surface thereof by supporting pins 17, and is moved upwards or downwards by a vertical movement of the supporting pins 17.

The configuration of the ashing apparatus for removing a resist is substantially the same as that of the conventional down-flow type plasma ashing apparatus. However, they are different from each other in the mechanism of vertically moving the target substrate 6. That is, in the conventional apparatus, the target substrate 6 has two restricted positions, i.e., a position in which the supporting pins 17 are in a status moved up (pin up) and a position in which the supporting pins 17 are in a status moved down (pin down). In the pin down state, a temperature of the target substrate 6 is as high as that of the susceptor 7. In the pin up state, since a large gap exists between the target substrate 6 and the susceptor 7, a temperature of the target substrate 6 is quite low (at a temperature close to the atmosphere of chamber 5).

Therefore, in the apparatus in accordance with the embodiment of the present invention, the supporting pins 17 are constructed to move vertically via a supporting member 18 by an elevation mechanism 19. By the elevation mechanism 19, a gap between the target substrate 6 and the susceptor 7 can be arbitrarily set by finely adjusting a height of elevation, so that the temperature of the target substrate 6 can be controlled. Although the elevation mechanism 19 capable of fine adjustment is not limited to a specific type, it may be constructed to move vertically by, e.g., a ball screw whose rotation angle controls elevation levels thereof.

The precise adjustment of the height of the target substrate 6 makes a variation in the amount of heat radiated from the susceptor 7 to the target substrate 6, so that a temperature of the target substrate 6 can be easily controlled to a desired level. That is, in the apparatus in accordance with the embodiment of the present invention, the supporting pins 17 are moved upwards in the pre-ashing process so that a proper gap exists between the target substrate 6 and the susceptor 7, whereby a temperature of the target substrate 6 is within the above temperature range of the pre-ashing processing. In the main ashing process, the supporting pins 17 are moved downwards as in the conventional case, and the target substrate is preferably exposed to hydrogen radicals after the temperature of the target substrate has increased.

The relationship between the temperature of the target substrate 6 and the gap between the target substrate 6 and the susceptor 7 can be obtained by experiments in a form of a calibration curve obtained by experience. However, the apparatus in accordance with the embodiment of the present invention has a configuration in which a surface temperature of the target substrate 6 is measured by a radiation temperature sensor 20 and a thermometer 21. This configuration makes it possible to quickly and precisely control the temperature of the target substrate 6 in the pre-ashing process, thereby improving the efficiency of the resist removal and reducing the resist residue greatly. Further, in the apparatus, there is installed on a sidewall of the chamber 5 an ending point detector (not illustrated) having a spectrometer capable of monitoring an emission spectrum inside the chamber 5.

Figure 2:
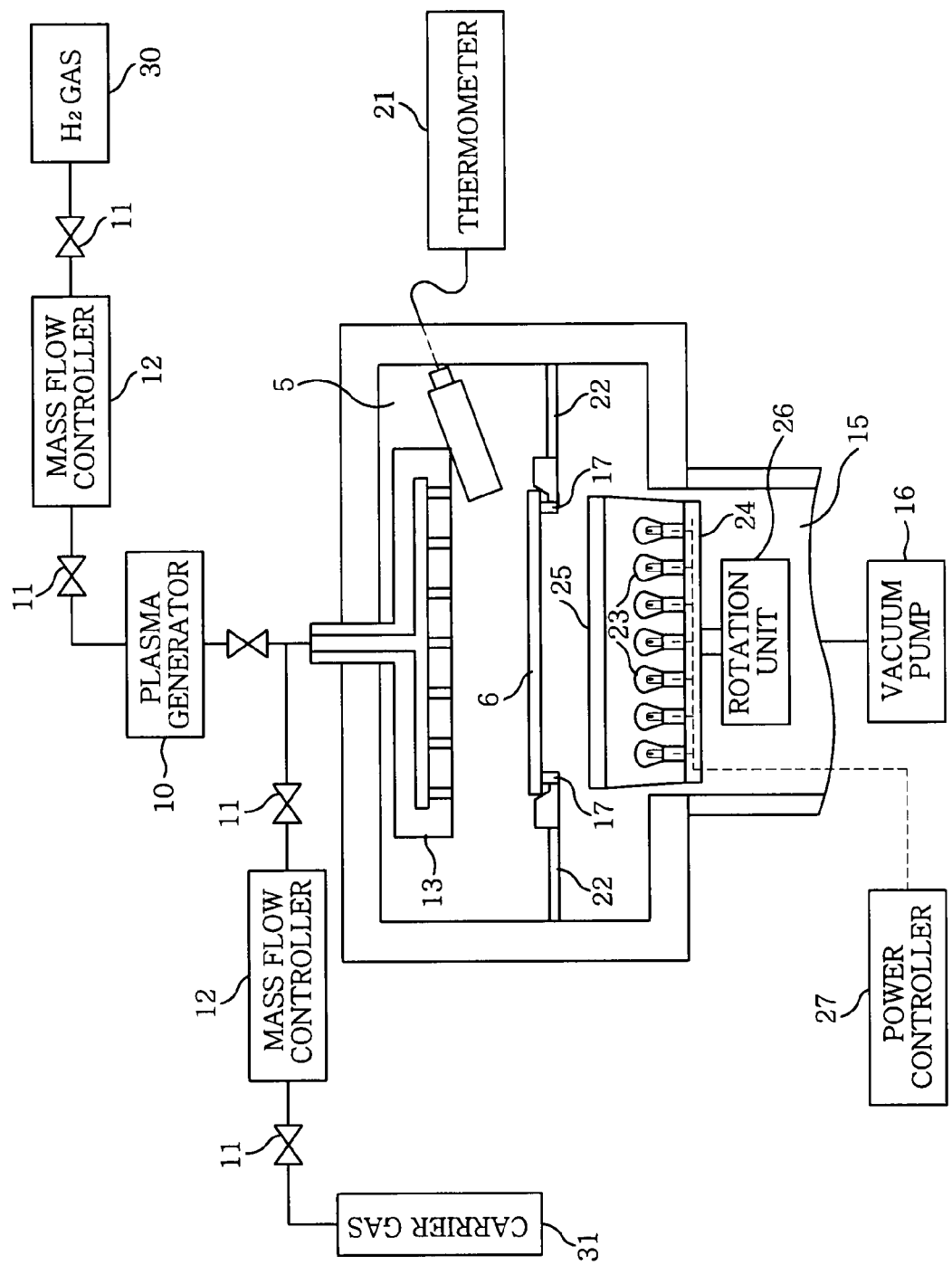
FIG. 2 describes a schematic cross sectional view of an ashing apparatus in accordance with another embodiment of the present invention.

FIG. 2 illustrates a schematic cross sectional view of an ashing apparatus in accordance with another embodiment of the present invention. This apparatus also serves as an etching and ashing apparatus and has a configuration of generating hydrogen radicals and exposing the target substrate 6 to the hydrogen radicals is the same as that of the apparatus of FIG. 1. The differences are in the heating method of the target substrate 6, the supporting method of the target substrate 6 and the temperature control method of the target substrate 6. In this apparatus, a mounting table of the target substrate 6 is not provided, and a bottom surface of the target substrate 6 is supported by supporting pins 17 attached to supporting arms 22 extending from side surfaces of the processing chamber 5. Further, the target substrate 6 is directly heated from a bottom side thereof by heating lamps 23 serving as a radiant heating unit provided thereunder.

The heating lamps 23 are directly disposed on a circular rotatable table 24. Infrared rays from the heating lamps 23 transmit a transmission window 25, and heat the bottom surface of the target substrate 6. The rotatable table 24 rotates by a rotation unit 26 so that the bottom surface of the target substrate 6 can be uniformly heated. The power to the heating lamps 23 are supplied by a power controller 27, and the intensity of radiant heat from the lamps can be arbitrarily controlled.

In order to perform the ashing method of the present invention by using this apparatus, first of all, a low power is provided to the heating lamps 23, so that a temperature of the target substrate 6 is set to a pre-ashing temperature (in a range of from about 80° C. to a temperature higher than a glass transition temperature Tg by about 30° C.). In this state, the pre-ashing is performed. Next, a high power is provided to the heating lamps 23, so that the temperature of the target substrate 6 is increased to about 250° C. or more. In this state, the main ashing is performed. Since the heat capacity of the target substrate 6 is small, the temperature increases from the pre-ashing temperature to the main ashing temperature in a short period of time.

In order to precisely control the temperature of the target substrate 6 in the pre-ashing process, the relationship between an input power to the heating lamps 23 and a temperature of the target substrate 6 can be experimentally made in a form of a calibration curve to control the substrate temperature. However, in the embodiment of the present invention, in order to quickly and precisely control the temperature of the target substrate, the apparatus has a configuration in which a surface temperature of the target substrate 6 is measured by the radiant temperature sensor 20 and the thermometer 21.

TEST EXAMPLES

The ashing method in accordance with the embodiment of the present invention and the conventional ashing method were respectively carried out in order to remove a plasma-etched photoresist by hydrogen radicals. Thereafter, ashing time and a generation state of a resist residue in both cases were compared.

As for a test substrate, there was used a 200 mm diameter silicon substrate on which a g-line resist is coated. The plasma etching conditions were the same as those set when the data of FIG. 3 were obtained. In the example of the present invention, a two-stage ashing process including a pre-ashing process and a main ashing process was carried out. In a comparative example, only a main ashing process was performed without a pre-ashing process.

An apparatus used herein is the same as that shown in FIG. 1. The pre-ashing process was performed in the pin up state, and the main ashing process was performed in the pin down state. Further, by using the elevation mechanism 19 for finely adjusting the height of the target substrate in the pin up state, a temperature of the target substrate was set to be about 100° C. in the pre-ashing process. Moreover, a power of the heater 8 buried in a susceptor 7 was controlled such that the temperature of the target substrate in the main ashing process was maintained at about 300° C. The conditions of a plasma generation power, a gas flow rate and the like during the ashing process are the same as those applied to the test of FIG. 3. The pre-ashing time was about 20 seconds and the main ashing time was prolonged by 30% after detecting an ending point by analyzing the emission spectrum from the chamber during the ashing process.

After completing the ashing process, the generation states of the resist residue were examined by naked eye. In the example of the present invention, the residue was not found at a central portion of the target substrate 6, and only a minute amount of residue was found near the periphery of the target substrate 6. Meanwhile, in the comparative example, a small amount of residue was found in the central portion of the target substrate, and a considerable amount of residue was found near the peripheral portion of the target substrate. That is, it was clear that the resist residue can be remarkably reduced by the method in accordance with the embodiment of the present invention.

In the ashing time, although the ashing time in the comparative example was about 190 seconds, the main ashing time in the example of the present invention was about 143 seconds, which was shortened by about 50 seconds. Therefore, it was clear that the method of the present invention can shorten the total ashing time compared to the conventional method even if the pre-ashing time of about 20 seconds is required in addition to the main ashing time.

From the above, it was found that it is possible to prevent the resist residue and shorten the ashing processing time by performing as the pre-ashing process the heating process for about 20 to 40 seconds at a temperature ranging from about 80° C. to a temperature higher than a glass transition temperature of a resist material by about 30° C.

While the invention has been shown and described with respect to the embodiments, it will be understood by those skilled in the art that various changes and modification may be made without departing from the scope of the invention as defined in the following claims.

What is claimed is:

1. An ashing method of a target substrate, applied after plasma-etching a part of a low-k film by using a patterned resist film as a mask in a vacuum processing chamber, comprising:
   a process of removing the resist film used for etching said low-k film in the vacuum processing chamber, including,
   a main ashing process, performing while maintaining a temperature of the target substrate at about 250° C. or higher, and
   a pre-ashing process, performed prior to the main ashing process, for ashing the target substrate for a time period while maintaining the target substrate at a temperature in a range from about 80 to 150° C.,
   wherein the pre-ashing process and the main ashing process are performed by using radicals of a reactant gas, and
   wherein the radicals of the reactant gas contain hydrogen radicals.

2. The ashing method of claim 1, wherein a maximum temperature of the target substrate during the pre-ashing process is higher than a glass transition temperature of the resist film by about 30° C.

3. The ashing method of claim 1, wherein the time period of the pre-ashing process is in a range from about 20 to 40 seconds.

4. The ashing method of claim 1, wherein the reactant gas is $H_2$ gas.

* * * * *